United States Patent
Ward et al.

(10) Patent No.: US 9,917,065 B1
(45) Date of Patent: Mar. 13, 2018

(54) POWER MODULE ASSEMBLY WITH REDUCED INDUCTANCE

(71) Applicant: GM GLOBAL TECHNOLOGY OPERATIONS LLC, Detroit, MI (US)

(72) Inventors: Terence G. Ward, Waterford, MI (US); Constantin C. Stancu, Auburn Hills, MI (US); Marko Jaksic, Rochester Hills, MI (US); Brooks S. Mann, Royal Oak, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 0 days.

(21) Appl. No.: 15/260,858

(22) Filed: Sep. 9, 2016

(51) Int. Cl.
*H01L 23/52* (2006.01)
*H01L 23/64* (2006.01)
*H01L 23/373* (2006.01)
*H01L 25/07* (2006.01)
*H01L 23/50* (2006.01)
*H01L 23/66* (2006.01)
*H01L 23/40* (2006.01)

(52) U.S. Cl.
CPC ........ *H01L 23/645* (2013.01); *H01L 23/3735* (2013.01); *H01L 23/50* (2013.01); *H01L 23/66* (2013.01); *H01L 25/072* (2013.01); *H01L 2023/4087* (2013.01)

(58) Field of Classification Search
CPC ................... H01L 2924/30107; H05K 7/1432

USPC ......................................... 257/691, 758, 750
See application file for complete search history.

(56) References Cited

U.S. PATENT DOCUMENTS

| | | | | |
|---|---|---|---|---|
| 5,751,058 | A * | 5/1998 | Matsuki | H01L 25/072 257/678 |
| 7,119,437 | B2 * | 10/2006 | Morita | H01L 24/48 257/691 |
| 7,907,385 | B2 * | 3/2011 | Korich | H01G 2/04 361/305 |
| 2009/0091892 | A1 * | 4/2009 | Otsuka | H02M 7/003 361/715 |
| 2017/0154877 | A1 * | 6/2017 | Tanimoto | H01L 25/072 |

* cited by examiner

*Primary Examiner* — S. V. Clark
(74) *Attorney, Agent, or Firm* — Quinn IP Law

(57) ABSTRACT

A power module assembly has a plurality of electrically conducting layers, including a first layer and a third layer. One or more electrically insulating layers are operatively connected to each of the plurality of electrically conducting layers. The electrically insulating layers include a second layer positioned between and configured to electrically isolate the first and the third layers. The first layer is configured to carry a first current flowing in a first direction. The third layer is configured to carry a second current flowing in a second direction opposite to the first direction, thereby reducing an inductance of the assembly. The electrically insulating layers may include a fourth layer positioned between and configured to electrically isolate the third layer and a fifth layer. The assembly results in a combined substrate and heat sink structure. The assembly eliminates the requirements for connections between separate substrate and heat sink structures.

20 Claims, 4 Drawing Sheets

POWER MODULE ASSEMBLY WITH REDUCED INDUCTANCE

STATEMENT REGARDING FEDERALLY-SPONSORED RESEARCH OR DEVELOPMENT

This invention was made with Government support under Award No. DE-EE-0007285, awarded by Department of Energy-National Energy Tech Lab (NETL). The United States Government may have certain rights in this invention.

TECHNICAL FIELD

The present disclosure relates to a power module assembly having a reduced inductance.

BACKGROUND

Power modules having semi-conductor devices are employed in a variety of settings. For example, hybrid vehicles may utilize power modules to power a motor/generator. Power modules generally include separate substrate and heat sink structures which are connected via various means. For example, the separate substrate and heat sink structures may be connected via soldering.

SUMMARY

A power module assembly has a plurality of electrically conducting layers, including a first layer and a third layer. One or more electrically insulating layers are operatively connected to each of the plurality of electrically conducting layers. The electrically insulating layers include a second layer positioned between and configured to electrically isolate the first and the third layers. The first layer is configured to carry a first current flowing in a first direction. The third layer is configured to carry a second current flowing in a second direction opposite to the first direction, thereby reducing an inductance of the assembly. Stated differently, the net inductance is reduced by a cancellation effect of current going in opposite directions in the first and third layers.

The assembly results in a combined substrate and heat sink structure. The multi-layered assembly eliminates the requirements for connections, such as a solder joint, between separate substrate and heat sink structures. The power module assembly is configured to support high switching frequency operation and to provide high power density with low parasitic inductance. Additionally, eliminating the solder joint between a substrate and heat sink reduces an assembly step, which also improves the thermal performance of the power module assembly.

The plurality of electrically conducting layers includes a fifth layer. The electrically insulating layers include a fourth layer positioned between and configured to electrically isolate the third and the fifth layers. The plurality of electrically conducting layers and the electrically insulating layers may be integrally cast as a single piece. Each of the first, second, third, fourth and fifth layers are configured to be thermally conducting such that heat from the first layer is conducted to the fifth layer, via each of the second, third and fourth layers. The fifth layer may include a plurality of pins configured to dissipate the heat.

The first, third and fifth layers may each be composed of at least one of aluminum and copper. The second and the fourth layers may each be composed of aluminum nitride, aluminum oxide or silicon nitride. The first, second, third, fourth and fifth layers each define a first, second, third, fourth and fifth width, $W_1$, $W_2$, $W_3$, $W_4$, $W_5$, respectively. The first, second, third, fourth and fifth widths increase in ascending order, with the first width being the smallest width, $W_1 < W_2 < W_3 < W_4 < W_5$.

The second layer may include multiple sides. The first and second layers are centered at a first height ($h_1$) and a second height ($h_2$), respectively, from a reference level. The third layer may include a base portion centered at a third height ($h_3$) from the reference level, a first wrapping portion centered at the first height ($h_1$) and a second wrapping portion centered at the second height ($h_2$) from the reference level. The first and second wrapping portions may be configured to wrap around at least one of the multiple sides of the second layer. The first and second wrapping portions may be configured to wrap around the second layer in at least three directions.

The assembly may include a plurality of flexible circuits operatively connected to the first layer and configured to provide low inductance for a gate control loop. Each of the plurality of flexible circuits includes a respective drain, gate and source flexible member placed in proximity and electrically isolated from one another. A plurality of capacitors may be operatively connected to the first layer. A single bus bar is operatively connected to each of the plurality of capacitors. The single bus bar includes a first terminal and a second terminal. The first terminal is of opposite polarity relative to the second terminal.

The first layer may include a first conducting member and a second conducting member each centered at a first height ($h_1$) from a reference level. The first and second conducting members are spaced from one another in a direction perpendicular to the first height. The first and second conducting members may include a respective circuit pattern. The assembly may be configured to support operation at high switching frequencies. In one non-limiting example, the high switching frequency is at least 75 kHz. The operation at high frequencies is beneficial to the overall system design as it allows the reduction in volume, mass and size. The power module assembly is designed to incorporate wide band-gap semiconductor devices, which reduces the associated device energy losses. The power module is configured to use reverse conducting dies.

The above features and advantages and other features and advantages of the present disclosure are readily apparent from the following detailed description of the best modes for carrying out the disclosure when taken in connection with the accompanying drawings.

DESCRIPTION

Figure 1:
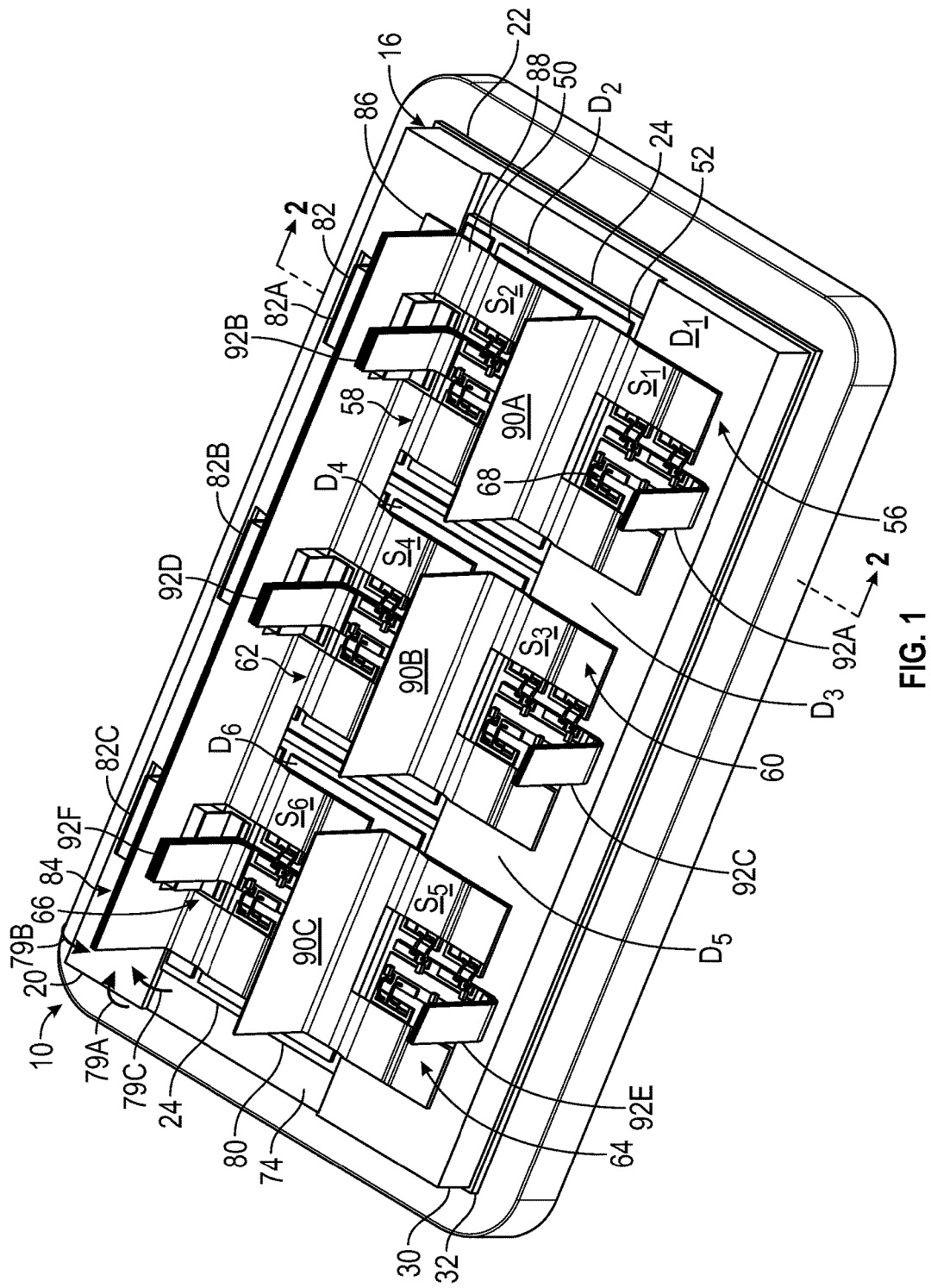
FIG. 1 is a schematic perspective view of a power module assembly.
Figure 2:
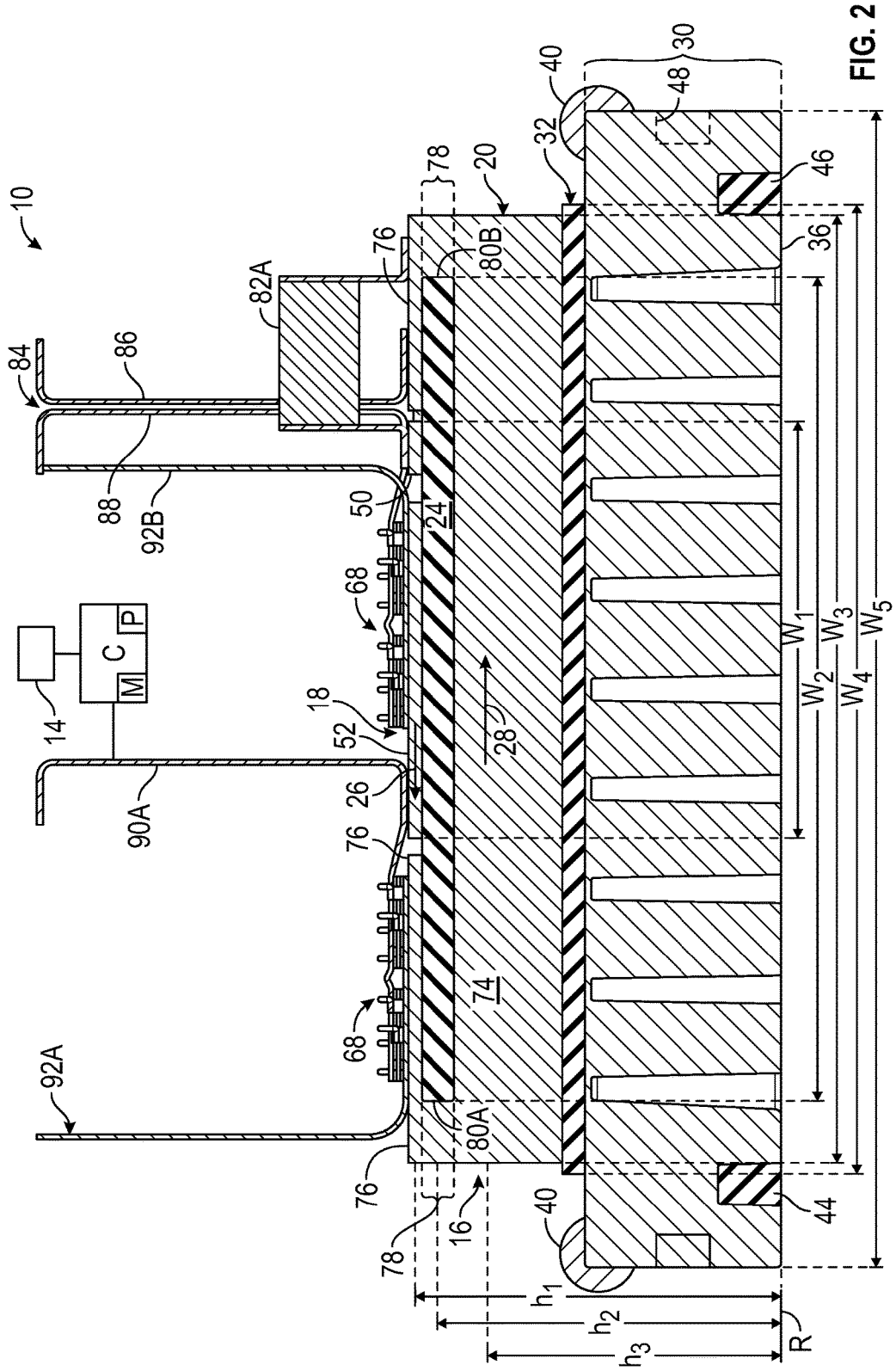
FIG. 2 is a schematic sectional view of the assembly shown in FIG. 1, through axis 2-2.

Referring to the drawings, wherein like reference numbers refer to like components, FIG. 1 schematically illustrates a power module assembly 10. FIG. 2 is a schematic sectional view of the assembly 10, through axis 2-2 of FIG.

1. The assembly 10 may be employed to power one or more components of a device 14 (see FIG. 2). The device 14 may be a mobile platform, such as, but not limited to, standard passenger car, sport utility vehicle, light truck, heavy duty vehicle, ATV, minivan, bus, transit vehicle, bicycle, robot, farm implement, sports-related equipment, boat, plane, train or any other transportation device. The device 14 may take many different forms and include multiple and/or alternate components and facilities. The Figures are not to scale.

Referring to FIG. 2, the assembly 10 has a plurality of electrically conducting layers 16, including a first layer 18 and a third layer 20. One or more electrically insulating layers 22 are operatively connected to each of the plurality of electrically conducting layers 16. The electrically insulating layers 22 include a second layer 24 positioned between and configured to electrically isolate the first and the third layers 18, 20. The first layer 18 is configured to carry a first current 26 flowing in a first direction. The third layer 20 is configured to carry a second current 28 flowing in a second direction opposite to the first direction, thereby reducing an inductance of the assembly 10. Stated differently, the net inductance is reduced by a cancellation effect of current going in opposite directions in the first and third layers 18, 20. The first layer 18 can be either positive or negative.

Referring to FIGS. 1-2, the electrically conducting layers 16 ("plurality of" omitted henceforth) include a fifth layer 30. The electrically insulating layers 22 include a fourth layer 32 positioned between and configured to electrically isolate the third and the fifth layers 20, 30. The third layer 20 may be employed as a return path for switch current, enabling a low inductance commutation path. The layout provides superior thermal, mechanical and electrical performance. The first, third and fifth layers 18, 20, 30 may each be composed of at least one of aluminum and copper. The second and the fourth layers 24, 32 may each be composed of any material know to those skilled in the art, including but not limited to, aluminum nitride, aluminum oxide and silicon nitride.

Referring to FIG. 2, each of the first, second, third, fourth and fifth layers 18, 24, 20, 32, 30 are configured to be thermally conducting such that heat from the first layer 18 is conducted to the fifth layer 30, via each of the second, third and fourth layers 24, 20, 32, in order. The fifth layer 30 is configured to dissipate the heat to a cooling medium (not shown). The fifth layer 30 may include a plurality of pins 36 to enable a more efficient dissipation of heat.

The electrically conducting layers 16 and the electrically insulating layers 22 may be integrally formed or cast as a single piece. The assembly 10, with the electrically conducting layers 16 and the electrically insulating layers 22, results in a combined substrate and heat sink structure. The assembly 10 eliminates the requirements for connections, such as a solder joint, between separate substrate and heat sink structures. The assembly 10 is configured to support high switching frequency operation and to provide high power density with low parasitic inductance. In addition, eliminating the solder joint between substrate and heat sink reduces an assembly step, which improves the thermal performance of the power module assembly 10.

Referring to FIG. 2, a clamp 40 may be operatively connected to the fifth layer 30 for mounting the assembly 10. The clamp 40 may extend around an entire perimeter (all sides) of the fifth layer 30, providing a uniform clamp load and reducing stresses in the four corners of the fifth layer 30. The clamp 40 eliminates the need for bolts for mounting the assembly 10, thereby allowing for reduced dimensions in the plane of the fifth layer 30.

Referring to FIG. 2, a sealing ring 44 (such as an O-ring) may be employed to seal the fifth layer 30 relative to a mounting member (not shown). The sealing ring 44 may be placed in a first groove 46 on the underside of the fifth layer 30. The sealing ring 44 may be placed in a second groove 48 on the side of the fifth layer 30.

Referring to FIG. 2, the first, second, third, fourth and fifth layers 18, 24, 20, 32, 30 each define a first, second, third, fourth and fifth width, $W_1$, $W_2$, $W_3$, $W_4$, $W_5$, respectively. The first, second, third, fourth and fifth widths increase in ascending order, with the first width being the smallest width, $W_1<W_2<W_3<W_4<W_5$. This configuration provides mechanical support and has the technical advantage of extending the voltage break line.

Referring to FIG. 2, the first layer 18 may include a first conducting member 50 and a second conducting member 52, each centered at a first height ($h_1$) from a reference level R. The first and second conducting members 50, 52 are spaced from one another in a direction perpendicular to the first height ($h_1$). The first and second conducting members 50, 52 may include a respective circuit pattern that is etched or otherwise affixed thereto.

Figure 3:
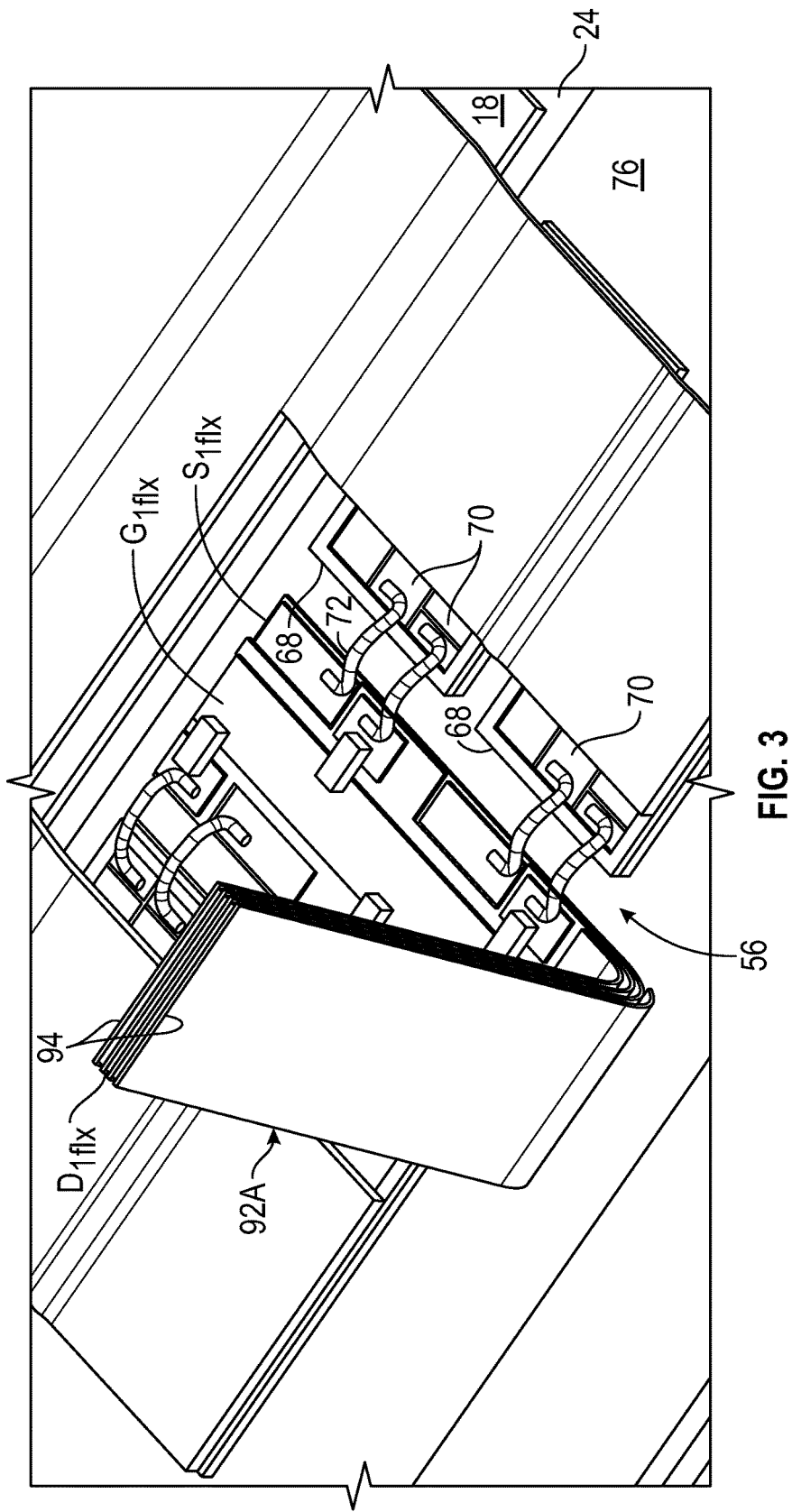
FIG. 3 is a schematic perspective enlarged view of a first sub-module of the assembly shown in FIG. 1.

Referring to FIG. 1, the assembly 10 may include a plurality of sub-modules, such as first, second, third, fourth, fifth and sixth sub-modules 56, 58, 60, 62, 64, 66. Each of the plurality of sub-modules includes at least one power die 68. FIG. 3 is a schematic perspective enlarged view of the first sub-module 56. Referring to FIG. 3, the power die 68 may be operatively connected to a copper pad 70 for metallization. The power die 68 may be packaged or metallized in any way known to those skilled in the art. Referring to FIG. 3, wire bonds 72 may be used to connect the copper pad 70 and the source component. The power die 68 may be composed of a semiconductor wafer, such as a silicon wafer. The power die 68 may be an Insulated Gate Bipolar Transistors (IGBT). The power die 68 may be a wide band gap device such as a VJFET (Vertical Junction Field Effect Transistors) or any other device known to those skilled in the art. The assembly 10 may be configured to support operation at high switching frequencies. In one non-limiting example, the high switching frequency is at least 75 kHz. The operation at high frequencies is beneficial to the overall system design as it allows the reduction in volume, mass and size. The power module assembly 10 is designed to incorporate wide band-gap semiconductor devices, which reduces the associated device energy losses. The power die 68 may be a reverse conducting die.

Referring to FIG. 2, the first and second layers 18, 24 are centered at a first height ($h_1$) and a second height ($h_2$), respectively, from a reference level R. The third layer 20 has parts at various distances from the reference level R. The third layer 20 includes a base portion 74 centered at a third height ($h_3$) from the reference level R, a first wrapping portion 76 centered at the first height ($h_1$) and a second wrapping portion 78 centered at the second height ($h_2$) from the reference level R. The second layer 24 may include multiple sides 80 (see FIG. 1), such as first and second sides 80A, B (see FIG. 2). The first and second wrapping portions 76, 78 may be configured to wrap around at least one or each of the multiple sides 80 of the second layer 24.

As noted above, the plurality of electrically conducting layers 16 and the electrically insulating layers 22 may be integrally formed or cast as a single piece. The first and second wrapping portions 76, 78 provide a cast connection between the top two conducting layers, i.e., the first and third layers, 18, 20, on the ends and sides as shown in FIG. 2, resulting in a significantly lower parasitic inductance loop. Stated differently, the third layer 20 (via the first and second wrapping portions 76, 78) "wraps around" the second layer 24 in one or more of the first, second and third directions 79A, B and C (see FIG. 1).

Referring to FIG. 1, the assembly 10 may include a plurality of capacitors 82 operatively connected to the first layer 18, such as first, second and third capacitors 82A-C. Each of the first, second and third capacitors 82A-C is operatively connected to respective terminals. Referring to FIG. 1, a single bus bar 84 may be operatively connected to each of the plurality of capacitors 82. Referring to FIGS. 1-2, the single bus bar 84 includes a first terminal 86 (which may be positive or negative) and a second terminal 88 (which may be negative or positive). The first terminal 86 is of opposite polarity relative to the second terminal 88. The first and second terminals 86, 88 may be composed of copper sheets. Generally each sub-module/capacitor 82 has a separate or individual bus bar. Employing a single bus bar 84 reduces the inductance further, due to the increased coupling of the sheets forming the first and second terminals 86, 88. Lower inductance is achieved as DC bus bar currents are flowing in the opposite directions, and cancellation of electromagnetic field is achieved effectively through a wider coupling area. Referring to FIGS. 1 and 2, during operation, the single bus bar 84 may transfer signals received from a DC source (not shown) to each power die 68, thereby generating an AC signal that may be transferred via the output nodes 90A, 90B and 90C to a component of the device 14.

Referring to FIG. 1, the assembly 10 may include a plurality of flexible circuits operatively connected to the first layer 18, such as first, second, third, fourth, fifth and sixth flexible circuits 92A-F. The first, second flexible circuits 92A-B are also shown in FIG. 2. Any number of flexible circuits suitable to the application at hand may be employed. The flexible circuits 92A-F are configured to provide low inductance for gate control loop. Each of the flexible circuits 92A-F include respective drain, gate and source flexible members.

Referring to FIG. 3, the first flexible circuit 92A includes drain, gate and source flexible members $D_{1flx}$, $G_{1flx}$, $S_{1flx}$, respectively. As understood by those skilled in the art, the current carrier enters at the source flexible member $S_{1flx}$ and exits at the drain flexible member $D_{1flx}$, while the gate flexible member $G_{1flx}$ modulates current conductivity. The drain, gate and source flexible members $D_{1flx}$, $G_{1flx}$, $S_{1flx}$ are positioned in relatively close proximity to one another and are electrically isolated from one another via relatively thin insulating polymers 94. The drain, gate and source flexible members $D_{1flx}$, $G_{1flx}$, $S_{1flx}$ include conductive circuit patterns affixed onto. The conductive circuit patterns can be formed by etching metal foil cladding (such as copper) from polymer bases, plating metal, printing of conductive inks and other processes known to those skilled in the art. The drain, gate and source flexible members $D_{1flx}$, $G_{1flx}$, $S_{1flx}$ are configured to be relatively wide and relatively short in order to reduce inductance. In one example, the drain, gate and source flexible members $D_{1flx}$, $G_{1flx}$, $S_{1flx}$ each have a length of 3 cm and thickness of 0.25 mm.

Figure 4:
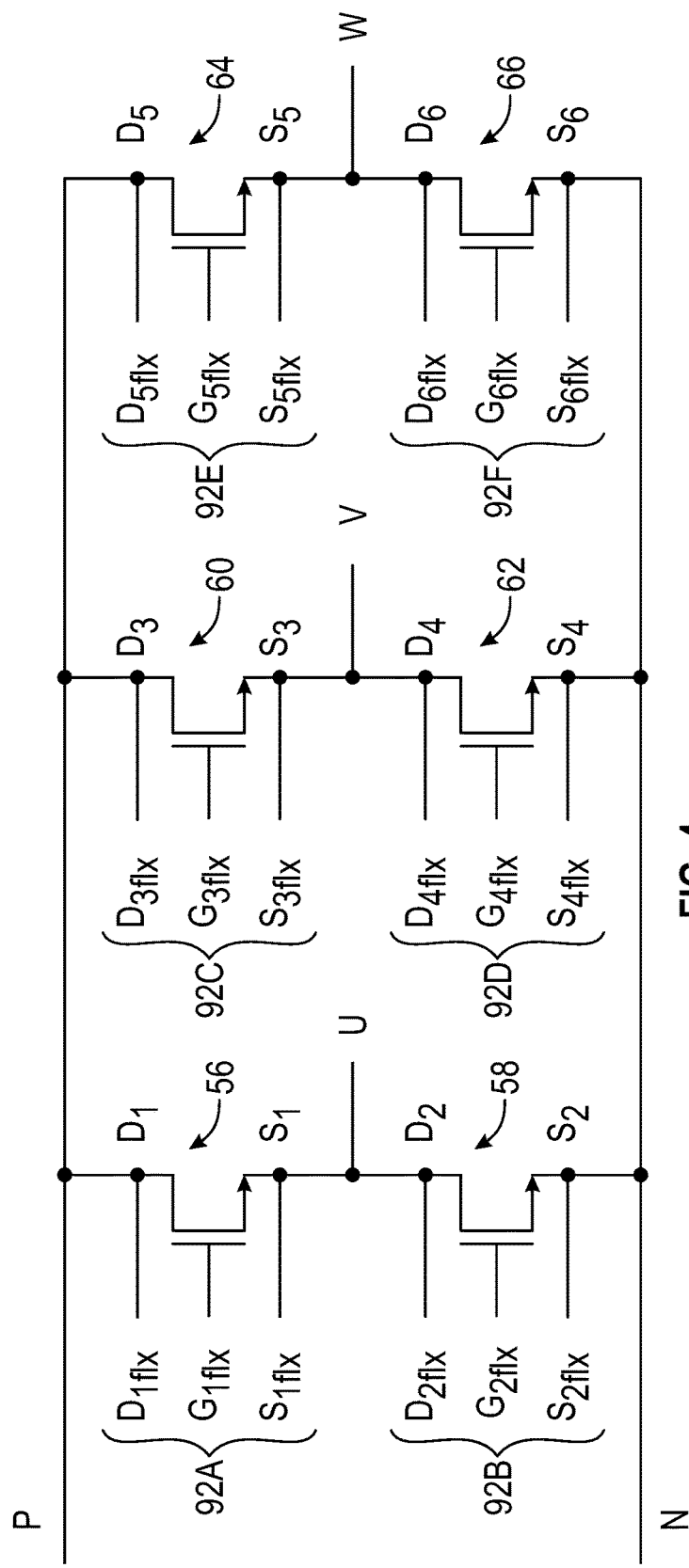
FIG. 4 is a schematic three-phase inverter control diagram for the assembly of FIG. 1.

Referring to FIG. 4, an example schematic three-phase inverter control diagram for the assembly 10 is shown. The configuration shown in FIG. 4 yields low parasitics in the control and measurement loop to minimize control loop inductance and coupling to power loop. As shown in FIGS. 1 and 4, the first, second, third, fourth, fifth and sixth sub-modules 56, 58, 60, 62, 64, 66 each include a respective drain electrode $D_1$, $D_2$, $D_3$, $D_4$, $D_5$, and $D_6$. As shown in FIGS. 1 and 4, the first, second, third, fourth, fifth and sixth sub-modules 56, 58, 60, 62, 64, 66 each include a respective source electrode $S_1$, $S_2$, $S_3$, $S_4$, $S_5$, and $S_6$. The letters "N" and "P" in FIG. 4 refer to the negative and positive nodes, respectively, i.e., the first terminal 86 and the second terminal 88 or vice-versa. The letters U, V and W refer to the three phases. The respective drain, gate and source flexible members for the second, third, fourth, fifth and sixth flexible circuits 92A, B, C, D, E and F are indicated in FIG. 4, respectively, as: ($D_{1flx}$, $G_{1flx}$, $S_{1flx}$), ($D_{2flx}$, $G_{2flx}$, $S_{2flx}$); ($D_{3flx}$, $G_{3flx}$, $S_{3flx}$); ($D_{4flx}$, $G_{4flx}$, $S_{4flx}$), ($D_{5flx}$, $G_{5flx}$, $S_{5flx}$), ($D_{6flx}$, $G_{6flx}$, $S_{6flx}$). Any other configurations known to those skilled in the art may be employed.

Referring to FIG. 2, the assembly 10 includes a controller C operatively connected to or in electronic communication with the assembly 10. Referring to FIG. 1, the controller C includes at least one processor P and at least one memory M (or any non-transitory, tangible computer readable storage medium) on which may be recorded instructions for controlling the delivery of power produced by the assembly 10. The memory M can store controller-executable instruction sets, and the processor P can execute the controller-executable instruction sets stored in the memory M.

The controller C includes a computer-readable medium (also referred to as a processor-readable medium), including any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which may constitute a main memory. Such instructions may be transmitted by one or more transmission media, including coaxial cables, copper wire and fiber optics, including the wires that comprise a system bus coupled to a processor of a computer. Some forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

Look-up tables, databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store may be included within a computing device employing a computer operating system such as one of those mentioned above, and may be accessed via a network in any one or more of a variety of manners. A file system may be accessible from a computer operating system, and may include files stored in various formats. An RDBMS may employ the Structured Query Language (SQL) in addition to a language for creating, storing, editing, and executing stored procedures, such as the PL/SQL language mentioned above.

The detailed description and the drawings or figures are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, it is possible that each of the characteristics described in one of the examples of an embodiment can be combined with one or more desired characteristics from other embodiments, resulting in other embodiments not described in words or by reference to the drawings. Accordingly, such other embodiments fall within the framework of the scope of the appended claims.

The invention claimed is:

1. A power module assembly comprising:
a plurality of electrically conducting layers including a first layer and a third layer;
one or more electrically insulating layers operatively connected to each of the plurality of electrically conducting layers;
wherein the one or more electrically insulating layers include a second layer positioned between and configured to electrically isolate the first and the third layers;
wherein the first layer is configured to carry a first current flowing in a first direction;
wherein the third layer is configured to carry a second current flowing in a second direction opposite to the first direction;
wherein the first, second, third, fourth and fifth layers are configured to be thermally conducting such that heat from the first layer is conducted to the fifth layer, via each of the second, third and fourth layers; and
wherein the fifth layer includes a plurality of pins configured to dissipate the heat.

2. The assembly of claim 1, wherein:
the plurality of electrically conducting layers includes a fifth layer; and
the one or more electrically insulating layers include a fourth layer positioned between and configured to electrically isolate the third and the fifth layers.

3. The assembly of claim 2, wherein the first, the third and the fifth layers are each composed of at least one of aluminum and copper.

4. The assembly of claim 2, wherein the second and the fourth layers are each composed of aluminum nitride.

5. The assembly of claim 2, wherein:
the first, second, third, fourth and fifth layers each define a first, second, third, fourth and fifth width, $W_1$, $W_2$, $W_3$, $W_4$, $W_5$, respectively; and
the first, second, third, fourth and fifth widths increase in ascending order, with the first width being the smallest width, $W_1 < W_2 < W_3 < W_4 < W_5$.

6. The assembly of claim 1, wherein:
the second layer includes multiple sides;
the first and second layers are centered at a first height ($h_1$) and a second height ($h_2$), respectively, from a reference level;
the third layer includes a base portion centered at a third height ($h_3$) from the reference level, a first wrapping portion centered at the first height ($h_1$) and a second wrapping portion centered at the second height ($h_2$) from the reference level; and
the first and second wrapping portions are configured to wrap around at least one of the multiple sides of the second layer.

7. The assembly of claim 6, wherein:
the first and second wrapping portions are configured to wrap around the second layer in at least three directions.

8. The assembly of claim 1, further comprising:
a plurality of flexible circuits operatively connected to the first layer;
wherein each of the plurality of flexible circuits includes a respective drain, gate and source flexible member placed in proximity; and
wherein the respective drain, gate and source flexible members are electrically isolated from one another.

9. The assembly of claim 1, wherein:
the first layer includes a first conducting member and a second conducting member each centered at a first height ($h_1$) from a reference level; and
the first and second conducting members are spaced from one another in a direction perpendicular to the first height, the first conducting member being electrically isolated relative to the second conducting member.

10. The assembly of claim 1, further comprising:
a plurality of capacitors operatively connected to the first layer;
a single bus bar operatively connected to each of the plurality of capacitors; and
wherein the single bus bar includes a first terminal and a second terminal, the first terminal being of opposite polarity relative to the second terminal.

11. The assembly of claim 1, further comprising:
a clamp operatively connected to the fifth layer and extending around an entire perimeter of the fifth layer, the clamp being configured to provide a uniform clamp load on the fifth layer.

12. A power module assembly comprising:
a plurality of electrically conducting layers including a first, a third and a fifth layer;
one or more electrically insulating layers operatively connected to each of the plurality of electrically conducting layers;
wherein the one or more electrically insulating layers include a second layer positioned between and configured to electrically isolate the first and the third layers;
wherein the one or more electrically insulating layers include a fourth layer positioned between and configured to electrically isolate the third and the fifth layers;
wherein the first layer is configured to carry a first current flowing in a first direction;
wherein the third layer is configured to carry a second current flowing in a second direction opposite to the first direction;
wherein the first and second layers are centered at a first height ($h_1$) and a second height ($h_2$), respectively, from a reference level;
wherein the third layer includes a base portion centered at a third height ($h_3$) from the reference level, a first wrapping portion centered at the first height ($h_1$) and a second wrapping portion centered at the second height ($h_2$) from the reference level; and
wherein the second layer includes multiple sides, the first and second wrapping portions being configured to wrap around at least one of the multiple sides of the second layer.

13. The assembly of claim 12, further comprising:
a plurality of flexible circuits operatively connected to the first layer and configured to provide low inductance for gate control and measurement loops;

wherein each of the plurality of flexible circuits includes a respective drain, gate and source flexible member placed in proximity; and wherein the respective drain, gate and source flexible members are electrically isolated from one another.

14. The assembly of claim 12, wherein:

the first layer includes a first conducting member and a second conducting member each centered at a first height ($h_1$) from a reference level;

the first and second conducting members are spaced from one another in a direction perpendicular to the first height, the first conducting member being electrically isolated relative to the second conducting member;

wherein the assembly is configured to support a high switching frequency operation of at least 75 kHz; and further comprising:

a plurality of power dies operatively connected to the first layer, the plurality of power dies including reverse conducting dies.

15. The assembly of claim 12, further comprising:

a plurality of capacitors operatively connected to the first layer;

a single bus bar operatively connected to each of the plurality of capacitors;

a plurality of power dies operatively connected to the first layer; and wherein the single bus bar includes a first terminal and a second terminal, the first terminal being of opposite polarity relative to the second terminal.

16. The assembly of claim 15, further comprising:

a clamp operatively connected to the fifth layer and extending around an entire perimeter of the fifth layer, the clamp being configured to provide a uniform clamp load on the fifth layer; and wherein the plurality of power dies includes reverse conducting wide band gap semiconductor dies.

17. The assembly of claim 12, wherein:

the first, second, third, fourth and fifth layers are configured to be thermally conducting such that heat from the first layer is conducted to the fifth layer, via each of the second, third and fourth layers;

the fifth layer includes a plurality of pins configured to dissipate the heat; and the third layer and the fourth layer extend sufficiently close to an edge of the fifth layer so as to provide structural support beyond the plurality of pins.

18. A power module assembly comprising:

a plurality of electrically conducting layers including a first layer and a third layer;

one or more electrically insulating layers operatively connected to each of the plurality of electrically conducting layer;

wherein the one or more electrically insulating layers include a second layer positioned between and configured to electrically isolate the first and the third layers;

a clamp operatively connected to the fifth layer and extending around an entire perimeter of the fifth layer, the clamp being configured to provide a uniform clamp load on the fifth layer;

wherein the first layer is configured to carry a first current flowing in a first direction; and wherein the third layer is configured to carry a second current flowing in a second direction opposite to the first direction.

19. The assembly of claim 18, further comprising:

a plurality of capacitors operatively connected to the first layer;

a single bus bar operatively connected to each of the plurality of capacitors; and wherein the single bus bar includes a first terminal and a second terminal, the first terminal being of opposite polarity relative to the second terminal.

20. The assembly of claim 18, further comprising:

a plurality of flexible circuits operatively connected to the first layer;

wherein each of the plurality of flexible circuits includes a respective drain, gate and source flexible member placed in proximity; and wherein the respective drain, gate and source flexible members are electrically isolated from one another.

\* \* \* \* \*